United States Patent [19]

Roberts et al.

[11] Patent Number: 4,608,672
[45] Date of Patent: Aug. 26, 1986

[54] SEMICONDUCTOR MEMORY

[75] Inventors: Peter C. T. Roberts, Plymouth; Tho T. Vu, Fridley, both of Minn.

[73] Assignee: Honeywell Inc., Minneapolis, Minn.

[21] Appl. No.: 513,872

[22] Filed: Jul. 14, 1983

[51] Int. Cl.[4] .............................................. G11C 8/00
[52] U.S. Cl. ..................................... 365/230; 365/105
[58] Field of Search ................. 365/94, 103, 105, 189, 365/190, 230

[56] References Cited

U.S. PATENT DOCUMENTS

| | | | |
|---|---|---|---|
| 3,886,531 | 5/1975 | McNeill | 365/155 |
| 4,096,584 | 6/1978 | Owen, III et al. | 365/227 |
| 4,208,730 | 6/1980 | Dingwall et al. | 365/203 |
| 4,276,617 | 6/1981 | Le | 365/189 |
| 4,347,585 | 8/1982 | Eardley | 365/105 |
| 4,393,472 | 7/1983 | Shimada et al. | 365/189 |
| 4,394,752 | 7/1983 | Boudon et al. | 365/230 X |

OTHER PUBLICATIONS

J. F. Gunn et al., "A Bipolar 16K ROM Utilizing Schottky Diode Cells", 1977 IEEE International Solid-State Circuits Conference, Session X:LSI Technology, Feb. 1977.

J. Lohstroh Article "ISL, A Fast and Dense Low-Power Logic, Made in a Standard Schottky Process, Journal of Solid-State Circuits, vol. SC-14, No. 3, Jun. 1979.

Honeywell's Preliminary Interim Phase 1 Technical Report.

Primary Examiner—Joseph A. Popek
Attorney, Agent, or Firm—William T. Udseth

[57] ABSTRACT

An electronic device is provided which includes first and second memory arrays, each capable of storing data at locations therein, and an address decoder positioned between the first and second memory arrays for decoding address signals input thereto and corresponding to the locations. The address decoder is advantageously configured as a set of ISL gates or MESFET logic gates. It is further advantageous to form the memory arrays of Schottky diodes which, when employed with the ISL configuration for an address decoder, utilizes the same Schottky diode in the memory arrays as are utilized in the ISL gates. A further refinement provides a precharged circuit for each bit line.

4 Claims, 6 Drawing Figures

SEMICONDUCTOR MEMORY

The United States Government has rights in this invention pursuant to Contract No. F33615-81-C-1527 awarded by the Air Force.

BACKGROUND OF THE INVENTION

1. Field of the Invention

This invention relates to semiconductor memories where the address decoder is placed in the center of the data field, and particularly relates to read only memories (ROM's) utilizing Integrated Schottky logic (ISL) or metal-semiconductor field effect transistors (MESFET) gates as word line drivers in conjunction with Schottky diode memory arrays.

2. Prior Art

Semiconductor memories seek to maximize packing density, minimize power dissipated, afford maximum speed of read and write operations and seek to provide memory chips which are easily processed to be fully functional. Diode data fields are advantageous because they usually exhibit high yield and afford relatively high packing density. This is particularly true of Schottky diode arrays because of the high yield in processing Schottky diodes. Examples of a read or reproduced only storage (ROS) matrix and a transistor switching circuit where Schottky diodes form memory arrays are U.S. Pat. Nos. 4,347,585 issued to Eardley and 4,276,617 issued to Le, respectively.

In the Eardley patent complex TTL word line gates (such as gate 19A) and complicated sense amplifiers (such as amplifier 86A) each involving several transistors, are employed. This necessitates the use of relatively large chip areas for the gates. In Le, two types of Schottky diode barriers (i.e., high barrier diodes such as diodes 31-nn and 70-7n and low barrier diodes such as 90-9n) are included in the circuit. The use of two types of Schottky diodes entails more complicated processing than if only one Schottky diode type were employed. Additionally, both Le and Eardley place their circuits' address decoders (in Le see circuits 110 and 120 and in Eardly see circuits 19A and 40A) on the periphery of the data field memory arrays. For a data bit located at the extreme of the field from either the column or row driver, or both, this necessitates the maximum voltage drop along the corresponding bit and/or word line in order to affect data at the remote location. It would be preferable to reduce the voltage drop needed to affect data at remote locations for a given memory size relative to the configurations of Eardly or Le. Reductions in the voltage drop would reduce the noise margin and thus soften the design margin or allow more data bits to be designed within a circuit for a given noise margin than configurations such as Eardley or Le.

SUMMARY

The present invention is an electronic device, comprising: first and second memory arrays, each capable of storing data at locations therein, and an address decoder positioned between the first and second memory arrays for decoding address signals input thereto and corresponding to the locations. The address decoder is advantageously configured as a set of ISL gates or MESFET logic gates. It is further advantageous to form the memory arrays of Schottky diodes which, when employed with the ISL configuration for an address decoder, utilizes the same Schottky diode in the memory arrays as are utilized in the ISL gates. A further refinement provides a precharged circuit for each bit line.

DESCRIPTION OF THE PREFERRED EMBODIMENTS

Figure 1:
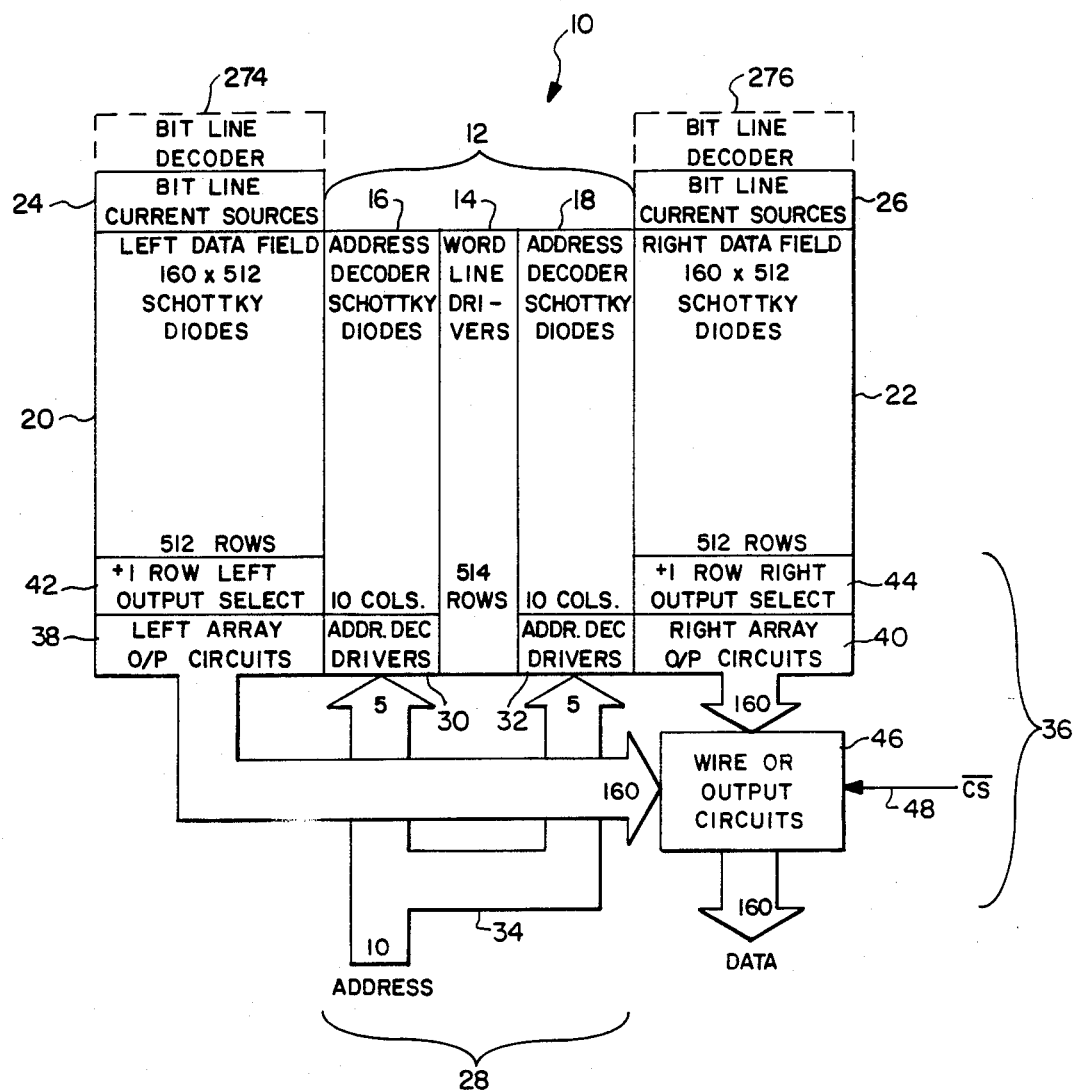
FIG. 1 displays an example of a ROM configured in accordance with the architecture of the present invention.

Device 10 (see FIG. 1) is a device for processing data input or stored thereon as electronic signals, such a semiconductor memory device. The present invention is particularly adapted to be used as a read only memory (ROM). The architecture of such a ROM is shown, by way of example, in FIG. 1.

Device 10 includes a centrally located address decode means 12 comprised, for example, of a set of word line drivers 14 flanked by first and second diode arrays 16 and 18, respectively. First and second memory arrays 20 and 22 are located, respectively, on the left and right of address decode means 12. Current sources 24 and 26 are provided adjacent to arrays 20 and 22, respectively.

Means for inputting address information 28 into address decoder means 12 is included in device 10. Address input means 28 includes first and second sets of address decode drivers 30 and 32, respectively, and means for inputting electronic signals 34 into address decode drivers 30 and 32.

Means for outputting data 36 from device 10 includes left array output means 38 and right array output means 40, each operatively associated with memory arrays 20 and 22, respectively. Left memory array select means 42 and right memory array select means 44 can be further included. To reduce the number of output lines, means for providing "wired" logic outputs 46 is preferably included in output means 36 along with means for enabling 48 the extraction of data from device 10.

Figure 2:
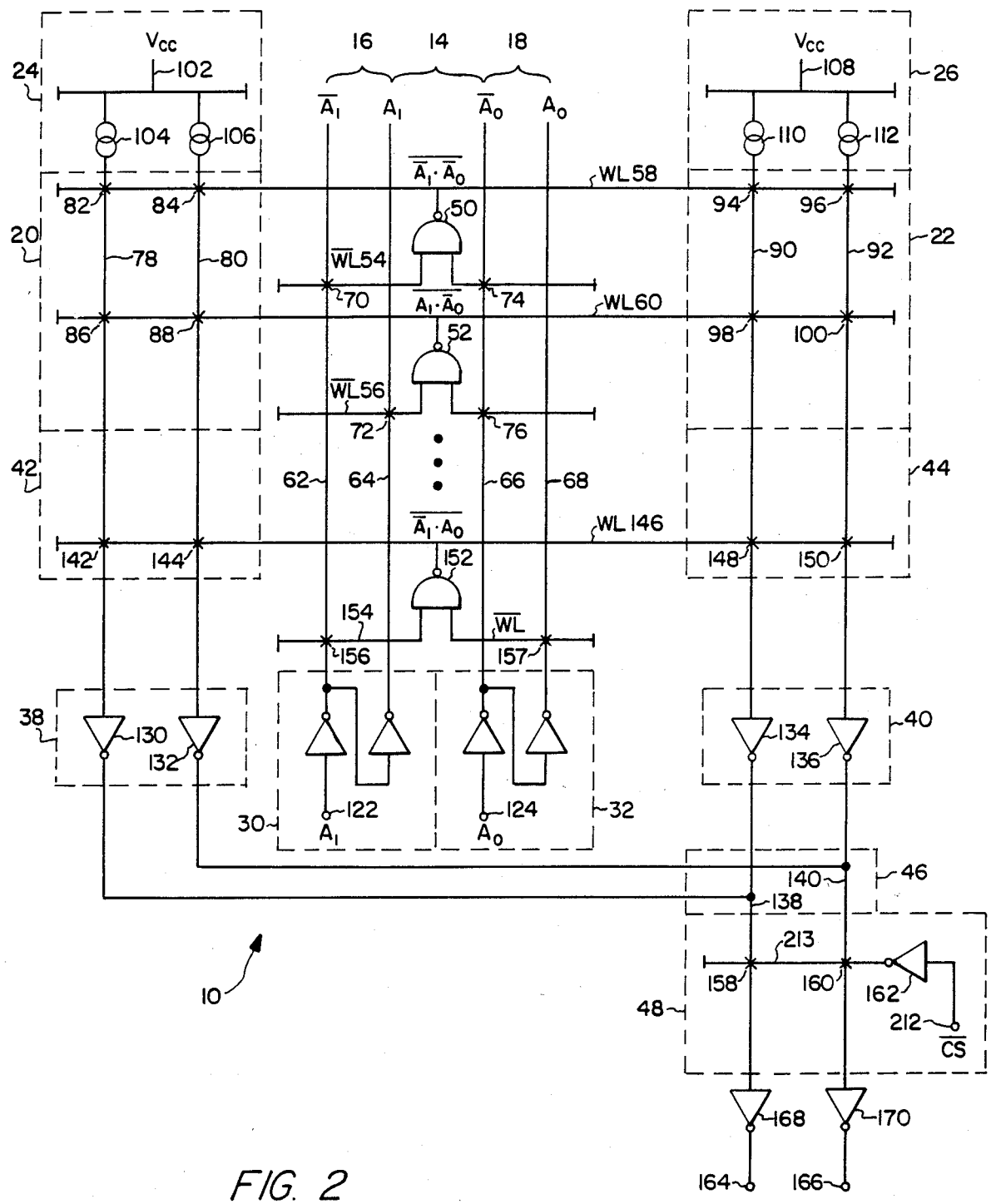
FIG. 2 is a schematic of a circuit which could be used to implement the architecture of FIG. 1.

A general schematic of device 10 illustrating in more detail components which can be advantageously employed in device 10 are shown in FIG. 2. Therein NAND gates 50 and 52 are examples of two of the set of word line drivers 14. Inputs to word line drivers 50 and 52 are along WL lines 54 and 56, respectively. Outputs from drivers 50 and 52 are along WL lines 58 and 60, respectively. WL lines are shown in truncated form for clarity only.

FIG. 2 shows only a portion of diode arrays 16, 18, 20 and 22 for illustrative purposes, it being understood that typically such diode arrays are much larger. Diode array 16 includes input lines 62 and 64. Diode array 18 includes input lines 66 and 68. An X in FIG. 2 indicates the presence of a diode (preferably a Schottky diode). In FIG. 2 diode array 16 includes two diodes 70 and 72. Diode array 18 includes diodes 74 and 76. Left memory array 20 includes bit lines 78 and 80 and diodes 82, 84, 86 and 88. Right memory array 22 includes bit lines 90 and 92 and diodes 94, 96, 98 and 100.

Current source 24 is connected in FIG. 2 to supply voltage $V_{cc}$ by line 102 and includes individual current sources 104 and 106 electrically connected to bit lines 78 and 80, respectively. Current source 26 is similarly connected to supply voltage $V_{cc}$ by line 108 and connects individual current sources 110 and 112 to bit lines 90 and 92, respectively.

Address drivers 30 and 32 include decode drivers 114, 116, 118 and 120 which are each advantageously configured as inverters. Within each decode driver 30 and 32, the inverters are advantageously paired so that the output of one is the input of another, thereby reducing the number of inputs (e.g., see inputs 122 and 124). This pairing is accomplished by lines 126 and 128. The output of inverters 114, 116, 118 and 120 are connected to lines 62, 64, 66 and 68, respectively.

Memory array output circuits 38 and 40 include inverters 130 and 132, and 134 and 136, respectively. Inverters 130, 132, 134 and 136 have their inputs connected to bit lines 78, 80, 90 and 92, respectively. The outputs of inverters 130 and 134 are "wired-OR" i.e., electrically connected so that a logic one input to either results in logic one output signal along a common output line 138. Likewise, inverters 132 and 136 are "wired-OR" to provide an output along common output line 140.

Select means 42 includes, for example, diodes 142 and 144 operatively associated with WL 146 to allow the selection of left memory 20. Select means 44 includes, for example, diodes 148 and 150 operatively associated with WL line 146 to allow the selection of right memory array 22. NAND gate 152, WL line 154 and diodes 156 and 157 are included in address decoder 12 and are employed to allow appropriate input signals to select (in conjunction with select means 42 and 44) between left memory array 20 and right memory array 22.

Output enable 48 includes diodes 158 and 160 and an inverter 162. Output terminals 164 and 166 are connected to common output lines 138 and 140 by inverters 168 and 170, respectively.

Figure 3:
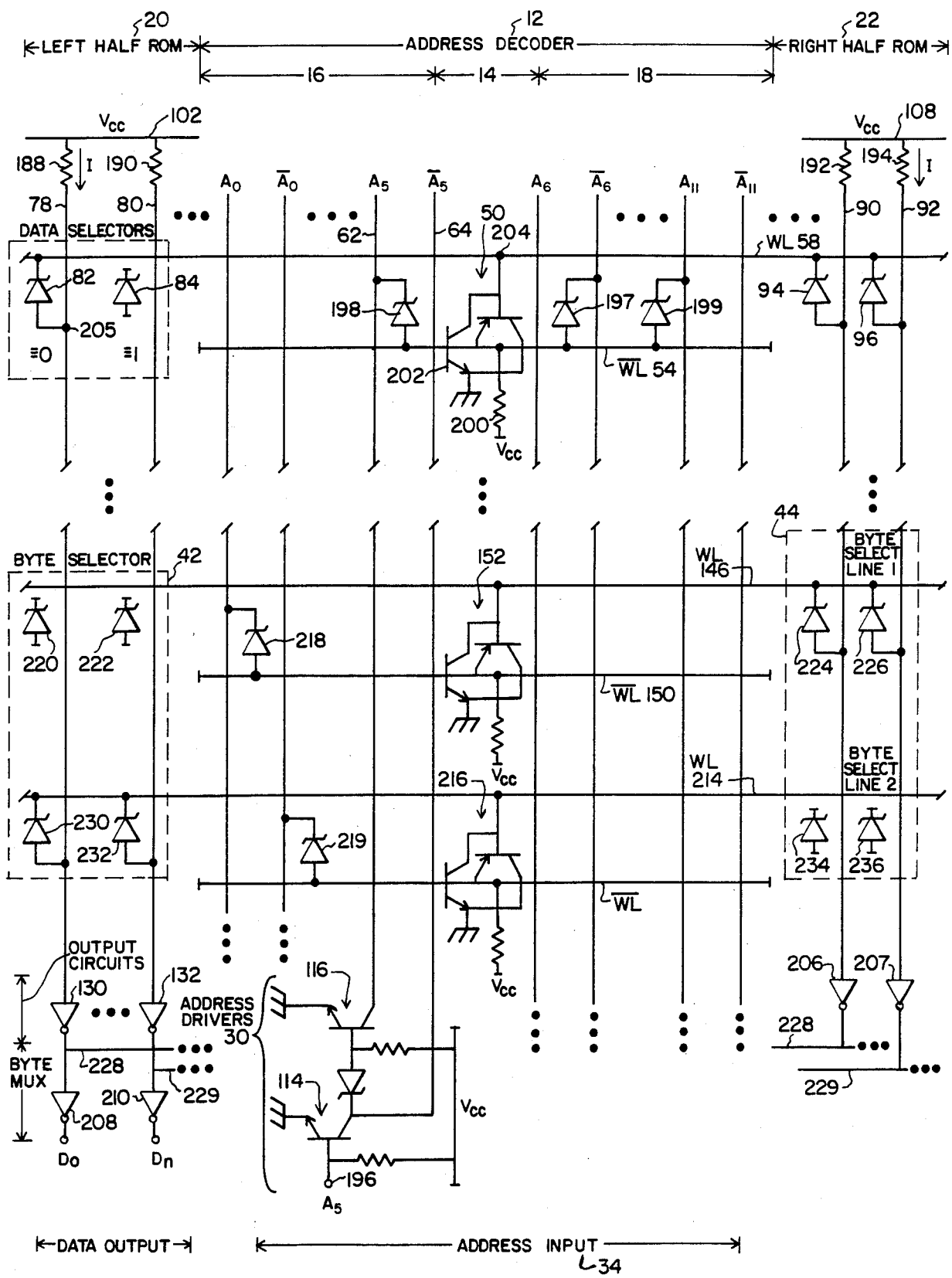
FIG. 3 is a detailed schematic of portions of a circuit which could be configured in accordance with the architecture of FIG. 1.

A more detailed schematic of FIG. 1 (and of portions of FIG. 2) is shown in FIG. 3. Some features of FIG. 3 differ from FIG. 2. The differences will be discussed further below. Functionally corresponding structure between FIGS. 2 and 3 are numbered the same for clarity. Additional or alternative structure between FIGS. 2 and 3 are additionally numbered and/or introduced as convenient in the discussion below of the operation of the device of FIG. 3. Note that the various diodes in FIG. 3 are preferably Schottky diodes. Within memory arrays 20 and 22, and memory array select means 42 and 44, diodes are present at all intersections of the bit and WL lines. However, diodes are connected between a bit line and a WL line at a particular intersection only if a logic 0 is desired at that location in either memory array 20 or 22, or only if data which would otherwise be transmitted to the output circuits 38 or 40, is to be optionally blocked by left or right output select means 42 and 44.

Figure 4:
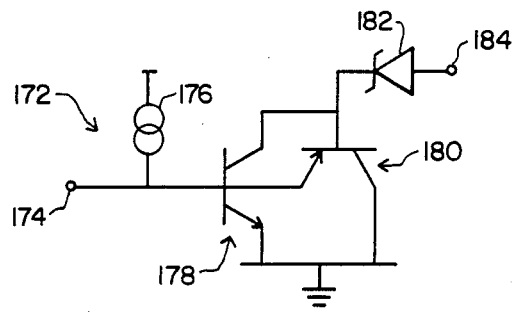
FIG. 4 is a schematic of the basic ISL gate.

Various inverters and NAND gates in FIG. 3 are preferably integrated Schottky logic (ISL) gates. ISL is a very dense, merged transistor logic (MTL) which is relatively fast because it saturates only slightly. FIG. 4 shows the basic ISL circuit 172 schematically. Its function is well known and is detailed in "ISL, a Fast and Dense Low-Power Logic Made in a Standard Schottky Process", J. Lohstroh, IEEE Journal of Solid States Circuits, Vol. SC-14, No. 3, June 1979, the same being incorporated herein by reference.

ISL circuit 172 includes a single input 174, current source 176 n-p-n transistor 178 with its base in common with the emitter of p-n-p transistor 180. A Schottky diode 182 is connected in series with the collector of transistor 178 and the circuit output 184. The basic function of circuit 172 is NAND, thus, with only one input, it also serves as an inverter. Current source 176 is typically a linear resistor (e.g., see resistors 188, 190, 192 and 194 in FIG. 3) connected in series between a voltage supply and the base of transistor 178.

The operation of device 10 will be discussed first with regard to FIG. 1, then with regard to FIG. 3. Referring to FIG. 1, data in the form of electrical signals is stored in memory arrays 20 and 22. Data is extracted by inputting the word address of data into address input means 34 which transmits the input address through address drives 30 and 32 to address decoders 16 and 18. In conjunction with word line drivers 14, address decoders 16 and 18 select the data stored at the location of the address input. If select means 42 and 44 are included, the word address input will include a select bit for selecting either only memory array 20 or only memory array 22. In the absence of output enable 48, once the word address is input, output means 36 will dump the contents of the address word out through output circuits 38 and 40 and thereby through wired-OR, output circuit 46. If memory select means 42 and 44 is included, data will be output only through either left array output circuits 38 or right array output circuits 40. With output enable 48, a further enabling signal must be supplied to the output circuitry to allow any data to be output.

Referring to FIG. 3, word address data is input at input terminals (only terminal 196 for $A_5$ is shown). Address drivers such as drivers 114 and 116 direct each input signal and the complement thereof along address decode line such as lines 62 and 64. Address decoders 16 and 18 will, by use of diodes located at the intersections of address decode lines and $\overline{WL}$ lines, provide inputs from selected address decode lines of either a logic 1 or a logic 0 to word line driver 14 and the NAND gates thereof. For example, the intersection of address decode line 62 (with input signal $A_5$ thereupon) and $\overline{WL}$ line 54 has a Schottky diode 198 connected across it. If a low voltage signal (i.e., a logic 0) is impressed on input terminal 196 diode 198 will be forward biased allowing current to flow from $V_{cc}$ through resistor 200, diode 198 and inverter 116 to ground. This in turn reduces the voltage to the base of n-p-n transistor 202 thus supplying a low voltage (i.e., a logic 0) to the input-base of NAND gate 50 from input $A_5$. If a high voltage had been input on $A_5$, a logic 1 would have been input to the base of NAND gate 50. NAND gate 50 includes, for example, two other inputs shown as $\overline{A_6}$ and $A_{11}$. Thus NAND gate 50 performs, in this example, the logic function ($A_5$ AND $\overline{A_6}$ AND $A_{11}$).

If any of the inputs to gate 50 is low (i.e., a logic 0) transistor 202 of gate 50 will be turned off thus driving the output node 204 of gate 50 high (i.e., logic 1). Only if all the inputs to gate 50 are logic 1 (i.e., $A_5=1$, $\overline{A_6}=1$, $A_{11}=1$) will diodes 197, 198 and 199 all be reverse biased, and thus provide a high input to the base of transistor 202, turning it on and providing a current path through transistor 202 to ground for any positive voltage on WL line 58. This in turn will drop the output of gate 50 low and the voltage on WL line 58 low (i.e., logic 0). When a word line is pulsed low, any diodes connected to it within memory arrays 20 or 22 at the intersection of the word line and bit lines within the memory arrays, are forward biased and will thus conduct current from $V_{cc}$ along the bit lines to ground by way of the ISL driver gate associated with the word line. For example if gate 50 is turned on, node 204 goes low forward biasing diode 82 in left memory array 20 thereby allowing current to flow from $V_{cc}$ along conduction line 102 through resistor 188, through diode 82 and word line 58 to ground through transistor 202. The voltage on bit line 78 at node 205 which connects to the anode of Schottky diode 82 would then drop from a high value to a low value. Thus the connection of a Schottky diode across the intersection of the bit word line is defined as the storage of a 0 at that intersection since addressing a word line will result in a low voltage on those bit lines which intersect the addressed word line and which have a diode connected across such an intersection.

Note in FIG. 3 that the intersection of bit line 80 and word line 58 in left half ROM 20 has a diode 84 present, but diode 84 is not connected across the intersection of bit line 80 and word line 58. Thus when word line 58 drops low when transistor 22 is turned on, bit line 80 will remain at a high voltage. Therefore such intersections are defined as a logic 1.

Output gates (i.e., inverters 130, 132, 206 and 207) serve as buffers between the memory arrays and other circuitry, provide the normal current amplification of a forward current mode transistor as well as performing the inversion function. Data appearing on the bit lines as a result of appropriate address signals to the address decode gates, could be output directly through the output circuit however it is convenient to employ the common output lines with the output gates (such as gates 134 and 136 in FIG. 2). This allows the left and right half memory arrays to share output lines in various "wired logic" functions. "Wired-OR" as shown in FIG. 3 is one example of wired output lines. Finally output signals are passed through inverters 208 and 210 to output terminals labeled $D_0 \ldots D_n$.

Not shown in FIG. 3, but included in FIGS. 1 and 2, is an output enable means 48. Referring to FIG. 2, this could simply be comprised of an input terminal 212, inverter gate 162 and diodes 158 and 160, each diode being connected between a common output line (e.g., lines 138 and 140) and an output inverter gate (e.g., gates 160 and 170. Diodes 158 and 160 can be adapted to be forward biased and thus shunt current along bit lines connected thereto along a conducting line 213 and provide uniform output along all bit lines. If an enable signal is entered at input 212, diodes 158 and 160 could thereby be reversed biased thus allowing whatever voltage signals were present on the bit line to pass to inverters 168 and 170 and thereby to output terminals 164 and 166.

FIG. 2 also includes a portion of select means 42 and 44. NAND gate 152 functions the same as NAND gates 50 and 52 of FIG. 2. Diodes associated with NAND gate 152 and word line 146 (i.e., diodes 142, 144, 148 and 150) are adapted to select only the left or right memory array and output data therein along common output lines 138 or 140.

The structure associated with the memory array select or byte select is expanded and shown in more detail in FIG. 3. Therein two word lines 146 and 214 can be used together to afford selection of only the memory in either the left or right ROMs 20 or 22. Word line 146 can be pulsed high or low by appropriate signals input to gate 152. And word line 214 can also be pulsed high or low depending on the input signals to gate 216. The input to NAND gate 152 can be provided along address decode line $A_0$ by way of diode 218 and the input to NAND gate 216 can be provided along address decode $\overline{A_0}$ by way of diode 219. By pulsing word line 146 low, diodes associated with that word line (i.e., diodes 220, 222, 224 and 226) will determine which byte of information along that word line can potentially be output.

For example since diodes 220 and 222 in left memory array 20 are not connected across the intersections with word line 146 of their respective bit lines 78 and 80, the output from gate 152 will not affect data on bit lines 78 and 80. However the logic condition of word line 146 will either reverse or forward bias diodes 224 and 226 thereby directly affect data on their corresponding bit lines 90 and 92. Forward biasing diodes 224 and 226 will shunt away any current on bit lines 90 and 92 (which would distinguish the logic condition on those bit lines) thus blocking the output along bit lines 90 and 92. Knowing the logic condition of the input to gate 152 (i.e., the logic condition of $\overline{A_0}$) one can then determine if data on bit lines 90 or 92 is being extracted or blocked. Diodes 230, 232, 234 and 236 would work similarly in conjunction with NAND gate 216.

In the above byte select example, the byte size equalled the number of bit lines in either the left or right memory array (e.g., 160 bits). The byte size can be reduced by adding further pairs of ISL gates similar to gates 152 and 216.

For example, if two additional gates (not shown) were employed along with two additional bit lines, e.g., $A_{12}$ and $\overline{A_{12}}$ (not shown), two additional word lines and additional diodes (also not shown), the byte size could be halved. The additional ISL gates would function the same as gates 152 and 216. With each memory array 20 and 22, bit lines connected by a diode to a byte select word line of one byte, would be unconnected to the corresponding byte select word line of the other byte. For example, diode 232 in memory array 20 connects bit line 80 to word line 214, and bit line 80 is in a first byte of memory array 20. The corresponding byte select word line in the additional ISL gates would not be connected to bit line 80. Similarly, where a bit line in a first byte selector is unconnected (e.g., diode 222), that bit line is connected in the second byte selector at a corresponding location. Each additional pair of gates would halve the previous byte size. Whatever the byte size, the bytes can be multiplexed by multiplex circuitry such as BYTE MUX shown in FIG. 3.

Figure 5:
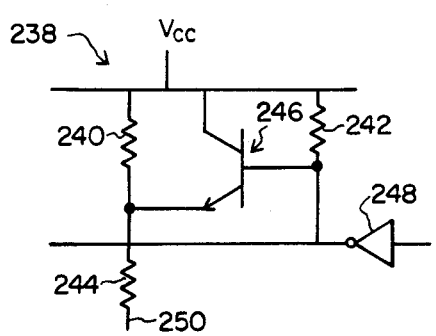
FIG. 5 is a schematic of a precharged circuit.

The current sources in FIG. 3 are shown as linear resistors 186, 188, 190, 192 and 194. FIG. 5 illustrates an alternative pre-charge current source configuration 238. Circuit 238 includes resistors 240, 242 and 244. Resistor 240 is connected across the collector and emitter of n-p-n transistor 246 and resistor 242 is connected across the base and collector of transistor 246. Resistors 240 and 244 are in series. Input signals to the base of transistor 246 are provided by way of inverter 248. When transistor 246 is on, almost all the current due to $V_{cc}$ is passed through transistor 246 and resistor 244 since the equivalent resistance of transistor 246 when it is on is much less than the resistance of resistor 240. When transistor 246 is off, almost all the current from $V_{cc}$ is passed through resistors 240 and 244. Resistors 244 and 240 could be, for example, 20k ohms and 150k ohms, respectively.

The pre-charge circuit 238 provides very low power operation by keeping the standby current of device 10 low. The memory arrays 20 and 22 are charged to a high potential by circuit 238 during standby period while keeping transistor 246 off in the standby mode. This provides a smaller current on bit line 250 than if transistor 246 were on. Thus in the "standby mode" the power dissipated by device 10 is reduced. When a word line of device 10 is pulsed high (to change to a new address) ISL gate 248 is adapted to pulse transistor 246 "on" thus shunting a higher current through transistor 246 and resistor 244 (to bite line 250) than is provided along bit line 250 in the standby mode. This high current condition will preferably continue long enough to charge the bit lines quickly to the high potential to facilitate the speed of operations within device 10.

Figure 6:
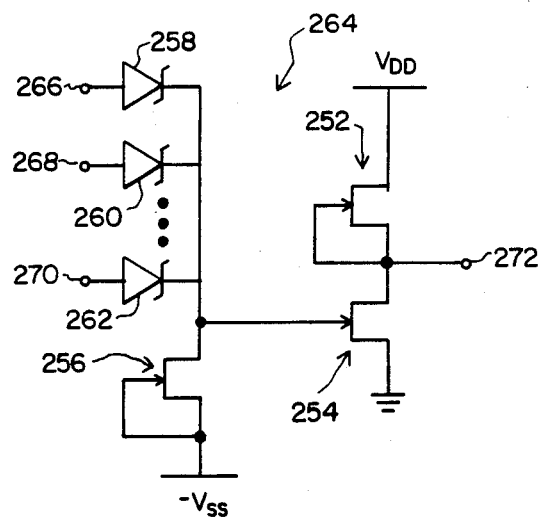
FIG. 6 is an example of a MESFET NOR gate which may be used advantageously in the present invention.

An alternative word line driver to the ISL gates of FIG. 3 is shown in FIG. 6. Therein three n-channel depletion mode MESFETS 252, 254 and 256 are connected with a set of input Schottky diodes 258, 260 and 262 to form NOR gate 264. The inputs are terminals 266, 268 and 270 and the output is terminal 272. MESFETS 252 and 256 have their gates and sources shorted to provide substantially constant current in gate 264.

Since gate 264 performs a NOR function, some minor modifications are necessary before gate 264 could be substituted directly for the NAND gate of FIG. 3. It may be convenient to adapt the left memory array 20 and right memory array 22 to output data when a word line is pulsed high instead of low. Reconfiguration of left and right memory arrays 20 and 22 to allow them to output data for select high could be accomplished simply by, for example, connecting the anode of Schottky diodes which are connected in FIG. 3 at the intersections of the bit and word lines, to the word lines and connecting the cathode of the Schottky diodes to the bit line.

There are numerous advantages of the present invention. With regard to the architecture of FIG. 1, placement of the address decoder 12 between memory arrays 20 and 22 provides smaller voltage drops for signals transmitted along word lines to the most remote bits for a given number of bit lines as compared to architectures which place the address decoder on the periphery of the memory. The smaller voltage drops are due to less resistance along the word lines. Preferably the address decoder would be placed so that the output nodes of the word line drivers (e.g., node 204 in FIG. 3) would have an equal number (or as nearly equally as possible) of bit lines on each side of the output node of a particular word line driver. Smaller voltage drops provide a higher noise margin for constructing device 10 which in turn implies wider design margins or allows more bits to be placed within the memory for the same noise margin. Placement of the address decoder within the memory arrays allows extensions to arbitrary bit lengths of data words by adding data bits to the left or right side.

Device 10's architecture provides a very flexible form factor, i.e., the number of word lines can be traded off against the number of bit lines per data byte or the number of bytes. Speed and power may be traded off to optimize access time for given applications. It is anticipated that very large arrays (i.e., one megabit or larger) can be easily fabricated using advanced photolithography wherein 1 to 0.5 micron lines and spaces are employed. The very high yield of ISL provides an inherent increase in density for whatever process is utilized. The precharge circuit provides for very low power operation at very high speed.

The structure of components within device 10 also provides many advantages. The ISL gates provide very dense, relatively fast ROMS requiring few processing steps. Only the word lines, address lines and bit sense lines necessitate transistors having emitter diffusions and thus only these transistors need freedom from pipe and similar leakage problems. No logic transational levels are required when device 10 is integrated on the same chip as other ISL, Schottky transistor logic (STL), integrated injection logic ($I^2L$) or iso-planar integrated injection logic ($I^3L$). ISL allows device 10 to operate over a wide temperature range and provides substantial hardness to total dose radiation since Schottky barrier diodes (SBD) present a small cross-section and require large interface state density to perturb I–V characteristics.

Other refinements of the present invention would be to use a first metal-via-second metal programming feature so that device 10 can be reprogrammed or pre-programmed on pre-processed wafers with very short turn around time. By utilizing a polysilicon or similar standard fuse to open or short circuit diodes at the intersection of word and bit lines, a programmable ROM (PROM) can be fabricated for electrical data writing. In this case a bit line decoder would be incorporated at the top of memories 20 and 22 (i.e., see bit lines decoders 274 and 276). Bit line decoders 274 and 276 along with address decoder 12 could be pulsed to write data at any data points within memories 20 and 22. When MESFETS are used as the gates in the address decoder, the processing of device 10 remains simple because metal is placed directly on a semiconductor as with the Schottky diodes.

What is claimed is:

1. An electronic device, comprising:
   first, second and third sets of Schottky diodea;
   first, second, third and fourth sets of electrical current conductive paths wherein said first set of Schottky diodes and said first and said second sets of electrical conductive paths are capable of storing data in digital form, and said second set of Schottky diodes and said second and third sets of electrical conductive paths are capable of storing data in digital form;
   a plurality of ISL gates wherein said ISL gates, said third set of Schottky diodes and said third and fourth sets of conductive paths are adapted to allow the extraction of at least some of said stored data in response to particular electrical signals impressed onto said third and fourth sets of electrical conductive paths, wherein each of said ISL gates includes an n-p-n transistor and only one of said electrically conductive paths of said second set of electrically conductive paths is directly electrically connected to the collector of said n-p-n transistor at a first node and only one of said electrically conductive paths of said fourth set of electrically conductive paths is directly electrically connected to the base of said n-p-n transistors at a second node; and
   means for impressing said particular electrical signals onto said third or fourth electrical current conductive paths.

2. The device of claim 1 wherein said first node divides said only one electrical conductive path connected directly to said collector into first and second portions, and wherein said first portion is directly connected to one terminal of each of said Schottky diodes in said first set of Schottky diodes which represent a first logic condition, and said second portion is directly connected to one terminal of each of said Schottky diodes of said second set of Schottky diodes which represents said first logic condition.

3. A solid state memory device, comprising:
 a solid region;
 a first set of conductive means arranged as columns;
 a second set of conductive means arranged as rows, wherein said rows and columns form a plurality of intersections;
 a plurality of Schottky diodes integral with said solid region, wherein at least some of said Schottky diodes connect one of said first set of conductive means to one of said second set of conductive means at selected of said intersections; and
 an address decoder for decoding address signals input to said decoder wherein said address signals correspond to certain of said intersections, said address decoder including a plurality of logic gates wherein said logic gates each include a current source, and first and second bipolar transistors, each of said transistors integral with said solid region and each having a base, an emitter and a collector, wherein the bases of said first and second transistors are doped with opposite conductivity types, and wherein said current souce is connected to the base of said first transistor and the emitter of said second transistor, the emitter of said first transistor is connected to a voltage reference point, the collector of said second transistor is connected to said voltage reference point, the collector of said first transistor is connected to the base of said second transistor and to one of said second set of conductive means.

4. A solid state memory device, comprising:
 a solid region;
 a first set of conductive means arranged as columns;
 a second set of conductive means arranged as rows, wherein said rows and columns form a plurality of intersections;
 a plurality of Schottky diodes integral with said solid region wherein at least some of said Schottky diodes connect one of said first set of conductive means to one of said second set of conductive means at selected of said intersections; and
 an address decoder for decoding address signals input to said decoder wherein said address signals correspond to certain of said intersections, said address decoder including a plurality of logic gates wherein said logic gates each include a field effect transistor having a source region, a drain region and a conductive gate, said source and drain region being formed in said solid region and being spaced apart, with said conductive gate overlying at least part of said space between said source and drain regions and being in contact with said solid region, and wherein said source region is connected to one of said second set of conductive means.

* * * * *